(12) United States Patent
Oyamada

(10) Patent No.: US 6,427,762 B2
(45) Date of Patent: Aug. 6, 2002

(54) MOUNT STRUCTURE OF COMMUNICATION EQUIPMENT

(75) Inventor: Takashi Oyamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/884,923

(22) Filed: Jun. 21, 2001

(30) Foreign Application Priority Data

Jun. 22, 2000 (JP) ........................................ 2000-188165

(51) Int. Cl.⁷ ................................................ H05K 7/20
(52) U.S. Cl. ...................... 165/80.2; 454/184; 361/690; 312/236; 174/16.1
(58) Field of Search ...................... 454/184; 165/104.33, 165/104.34, 80.2; 361/690, 700, 696; 174/15.2, 16.1; 312/236

(56) References Cited

U.S. PATENT DOCUMENTS

| | | | | |
|---|---|---|---|---|
| 3,396,780 A | * | 8/1968 | Koltuniak et al. ..... | 165/104.34 |
| 4,386,651 A | * | 6/1983 | Reinhard ................ | 165/104.33 |
| 4,535,386 A | * | 8/1985 | Frey et al. .............. | 165/104.33 |
| 5,040,095 A | * | 8/1991 | Beaty et al. ................. | 361/694 |
| 5,467,250 A | * | 11/1995 | Howard et al. .............. | 165/122 |
| 6,164,369 A | * | 12/2000 | Stoller .................... | 165/104.33 |
| 6,166,905 A | * | 12/2000 | Oyamada et al. .......... | 165/80.3 |
| 6,222,730 B1 | * | 4/2001 | Korvenheimo et al. ..... | 361/696 |

FOREIGN PATENT DOCUMENTS

| JP | 60-11825 | 3/1985 |
|---|---|---|
| JP | 11-121956 | 4/1999 |

\* cited by examiner

*Primary Examiner*—Allen Flanigan
(74) *Attorney, Agent, or Firm*—Foley & Lardner

(57) ABSTRACT

A mounting structure for communication equipment comprises two housings (a main body portion and a fixing portion) which are designed to be separable from each other, and the fixing portion is equipped with a heat exchanger for heat-exchanging heat generated in the main body portion with cold air, thereby radiating the heat from the inside of the main body portion to the outside.

7 Claims, 5 Drawing Sheets

MOUNT STRUCTURE OF COMMUNICATION EQUIPMENT

BACKGROUND OF THE INVENTION

1. Field of the Invention

The present invention relates to a mount structure of communication equipment and particularly, to a mount structure of communication equipment which can enhance the operational life of communication equipment and which can decrease the mounting time of the communication equipment.

2. Description of the Prior Art

In the mount structure of communication equipment used for a cellular phone system or the like, the internal heat generation in the communication equipment has increased more and more, and also the outer shape and weight of the overall housing of the communication equipment has become larger.

As shown in FIG. 1, the housing structure of conventional communication equipment is provided by an integral type communication equipment 50, and the outer shape and weight of the housing of the communication equipment increase in proportion to the internal power consumption. On the assumption that communication equipment 50 is fixed to pole 3 as a setup location, the weight of the communication equipment which a worker can carry by himself/herself is estimated to be equal to about 15 kg (kilogram) at maximum.

In order to reduce the size and weight of the housing, it is important to radiate the internal heat as much as possible, and specific improvements have been required to that end.

SUMMARY OF THE INVENTION

An object of the present invention is to provide a mount structure of communication equipment which can lessen the setup time and enhance the operative life of the communication equipment and is adapted to the heating value of the main body of the communication equipment and the environmental temperature around the setup place.

In order to attain the above object, a mount structure of the communication equipment according to the present invention comprises a main body portion containing a communication circuit unit and a fixing portion containing a heat exchanger, wherein the main body portion is fixed on the fixing portion, and the main body portion and the fixing portion are designed to be separable from each other.

The fixing portion is designed to have a substantially L-shape when it is viewed from the side of the fixing portion and so as to serve as a stand on which the main body portion is supported. The stand has a projecting portion which can be fitted to a recess portion formed at the bottom portion of the main body portion.

Further, the main body portion is equipped with packing means for providing a waterproof fit to an engagement surface with the fixing portion.

Still further, the fixing portion takes in cold air from the outside by the heat exchanger installed therein, and blows the cold air to the main body portion to exchange the cold air with heat generated by the communication circuit, thereby cooling the main body portion.

Still further, the heat exchange efficiency (dissipation efficiency) of the heat exchanger is selected in conformity with the calorific value of the main body portion and the surrounding environmental temperature condition of a setup place.

According to the present invention, since the main body of the communication equipment and the fixing portions are designed to be separable from each other when a setup job is carried out, the unitary mass of the communication equipment is reduced and thus the handling of the communication equipment is easy, so that the workability can be enhanced. In addition, the heat exchange efficiency of the heat exchanger can be adjusted in conformity with the calorific value of the main body of the communication equipment, and thus the optimum heat exchange efficiency can be selected in conformity with the surrounding environmental temperature condition of the setup place.

Since the fixing portion has a pedestal portion for supporting the main body of the communication equipment, a fabricating job is easily performed, and when the main body of the communication equipment is out of working order or repaired, it is sufficient to exchange only the main body portion of the communication equipment without detaching the overall equipment from a pole or the like. Therefore, the workability can be enhanced.

DETAILED DESCRIPTION OF THE PREFERRED EMBODIMENT MODES

Preferred embodiment modes according to the present invention will be described hereunder with reference to the accompanying drawings.

Figure 2:
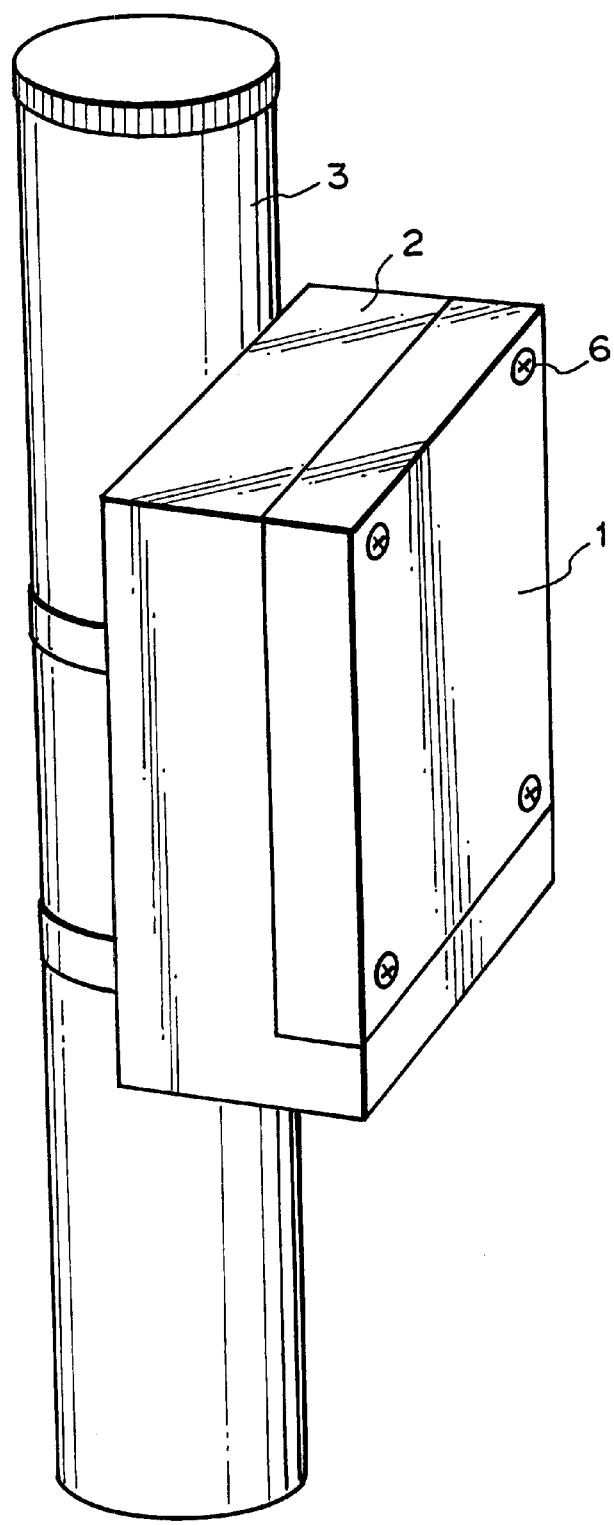
FIG. 2 is a perspective view showing the outlook of communication equipment according to an embodiment of the present invention.
Figure 3A:
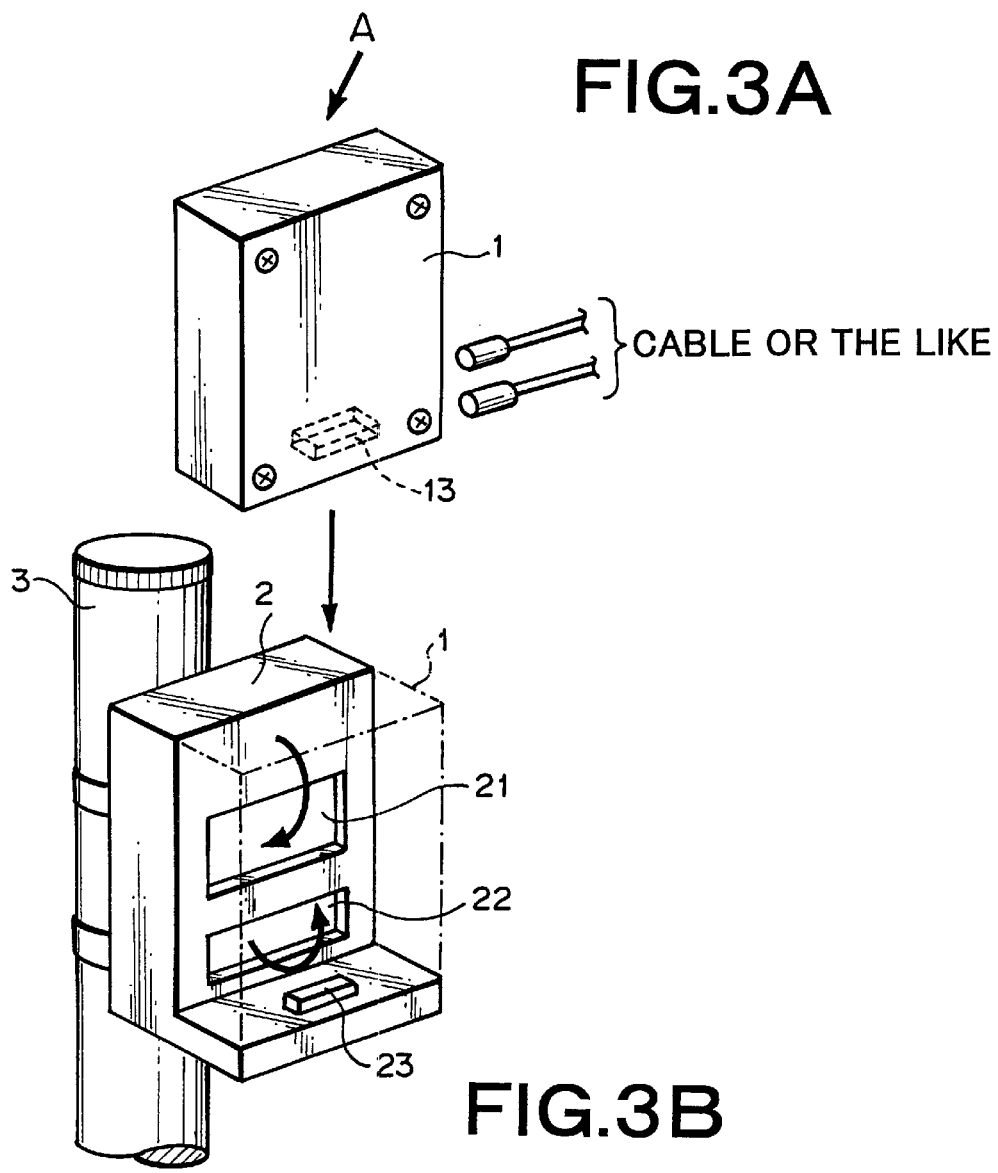
FIGS. 3A is an exploded perspective view showing a fabrication state of the communication equipment of the embodiment and FIG. 3B is an perspective view taken in the direction of the arrow "A" of FIG. 3A.
Figure 3B:
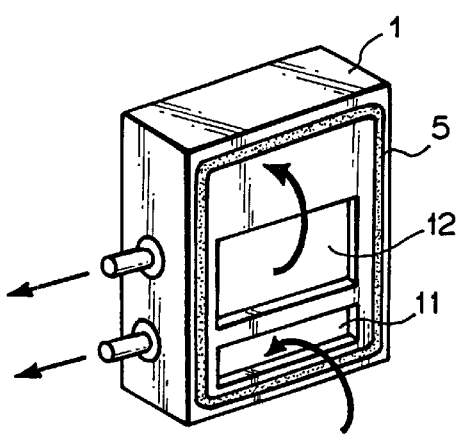
Figure 4:
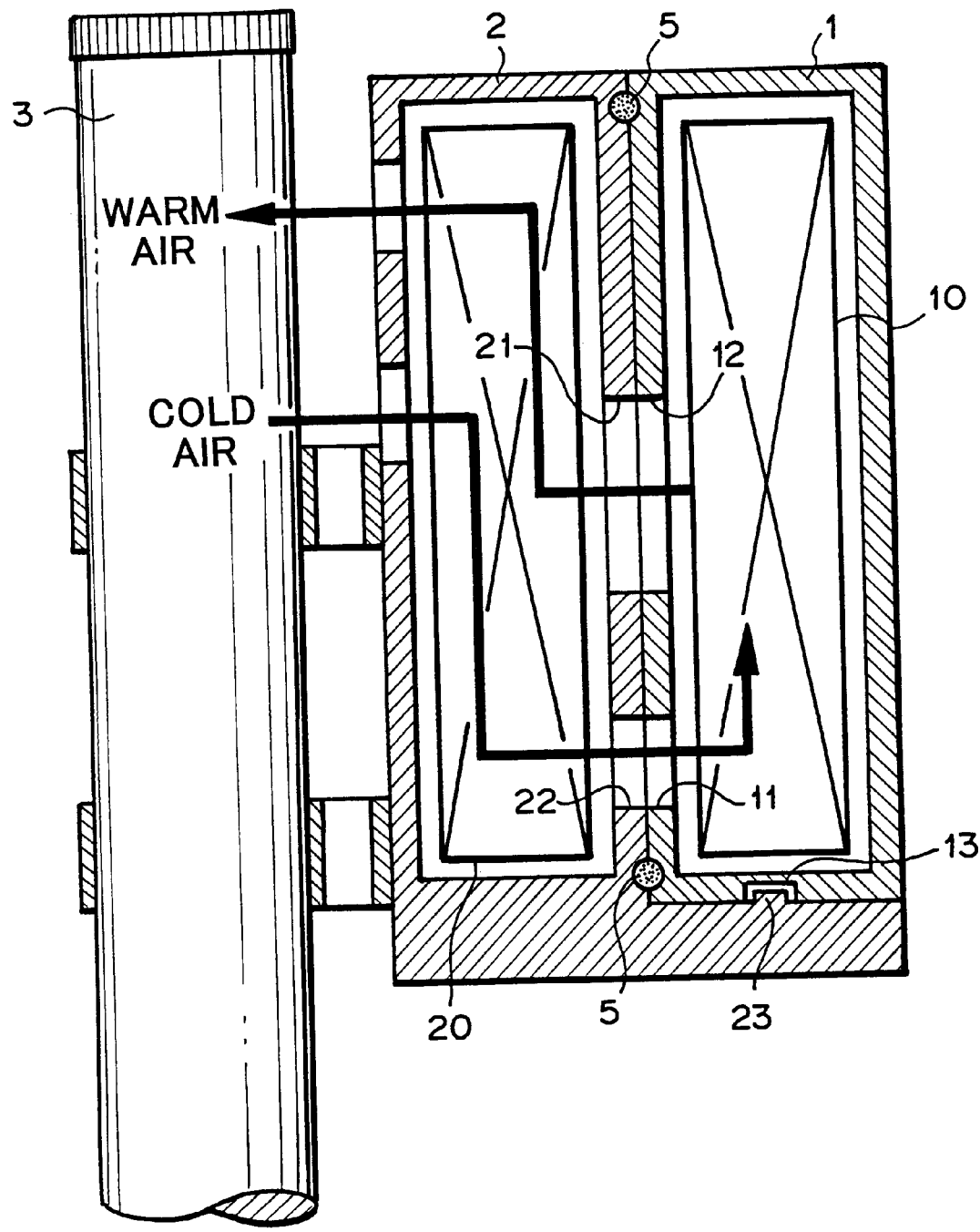
FIG. 4 is a longitudinally-sectional view showing a use state of set-up communication equipment.

FIG. 2 is a perspective view showing the outlook of communication equipment, FIG. 3A is an exploded perspective view showing a fabrication state of an embodiment, FIG. 3B is an perspective view taken in the direction of the arrow "A" of FIG. 3A, and FIG. 4 is a longitudinally-sectional view showing a use state of the set-up communication equipment.

As shown in FIGS. 2 to 4, the communication equipment according to this embodiment comprises two housings of main body portion 1 and fixing portion 2. The fixing portion 2 is designed as a housing having a substantially L-shaped section when it is viewed from the side thereof, and serves as a stand on which the main body portion 1 is mounted. Heat exchanger 20 of a heat pipe type or the like is accommodated in the fixing portion 2. The main body portion 1 of the communication equipment is designed as a box-shaped housing, and communication circuit unit 10 containing a communication circuit is accommodated in the housing.

Both the housings are integrally assembled with each other so as to form a circulating system in which heat (warm air) generated in the main body of the communication equipment is transferred (sucked) to the fixing portion side and then radiated (cooled) through the heat exchanger 20.

Recess portion 13 is formed at the bottom surface portion of the main body portion 1 of the communication equipment, and projecting portion 23 which is engageable with the recess portion 13 is formed at the L-shaped pedestal portion of the fixing portion 2. The main body portion 1 is fixed on the fixing portion 2 by fixing screws 6.

Next, the details of the communication equipment will be described in detail.

Referring to FIG. 2, the communication equipment comprising the main body portion 1 and the fixing portion 2 is generally fixed to pole 3 or a steel tower.

Referring to FIGS. 3A and 3B, the fixing portion 2 is fixed to the pole 3 by a band or the like. The main body portion 1 is designed so as to be mounted on the L-shaped pedestal at the lower portion of the fixing portion 2. The main body 1 of the communication equipment can be naturally set up at a predetermined position when the recess portion 13 of the main body 1 is fitted to the projecting portion 23 of the pedestal.

Waterproof packing 5 is mounted on the back surface of the main body 1 of the communication equipment, and thus it acts to hermetically seal both the housings of the main body portion 1 and the fixing portion 2 after they are assembled.

Referring to FIG. 4, it is necessary to radiate heat in some way because the internal temperature of the main body portion 1 is increased due to heat generated in the communication circuit unit (internal unit) 10. In this embodiment, the heat exchanger 20 is mounted in the fixing portion 2 to form a circulating system in which heat (warm air) at the main body portion 1 is sucked and radiated to the outside, and the outside air (cold air) is blown into the main body portion 1.

The main body portion 1 has an air-intake hole 11 and an air-exhaust hole 12 on the face of the fixing side. The fixing portion 2 has an air-intake hole 21 and an air-exhaust hole 22 on the face of the fixing side. The air-intake hole 11 and the air-exhaust hole 22 are fitted so as to pass cold air. The air-exhaust hole 12 and the air-intake hole 21 are fitted so as to pass warm air.

Figure 1:
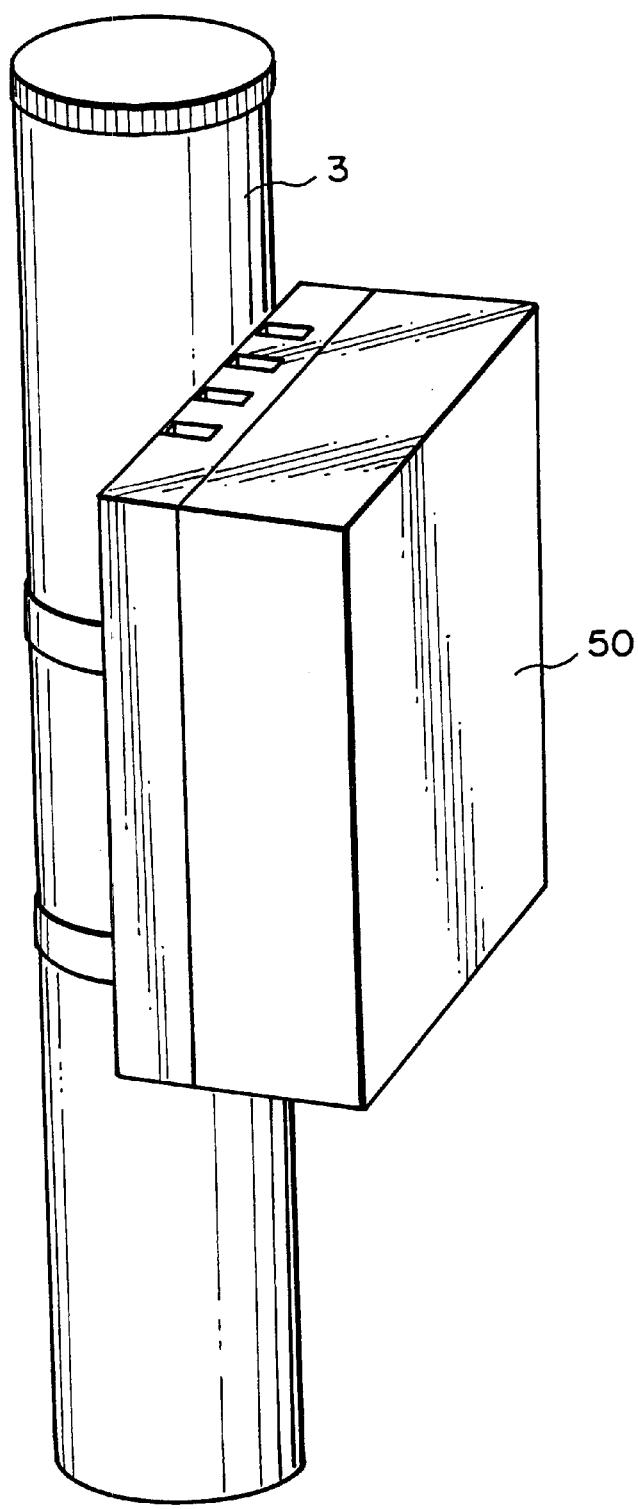
FIG. 1 is a perspective view showing the outlook of conventional communication equipment.

The specification of the heat exchanger 20 is determined in accordance with the using environmental temperature of the heat exchanger 20 and the power consumption of the main body portion 1. As is apparent from the figures, even when the main body 1 is out of working order, it is unnecessary to detach the overall equipment (both the fixing portion and the main body portion) from the pole unlike the conventional communication equipment as shown in FIG. 1, and thus the communication equipment can be relatively easily exchanged.

Figure 5:
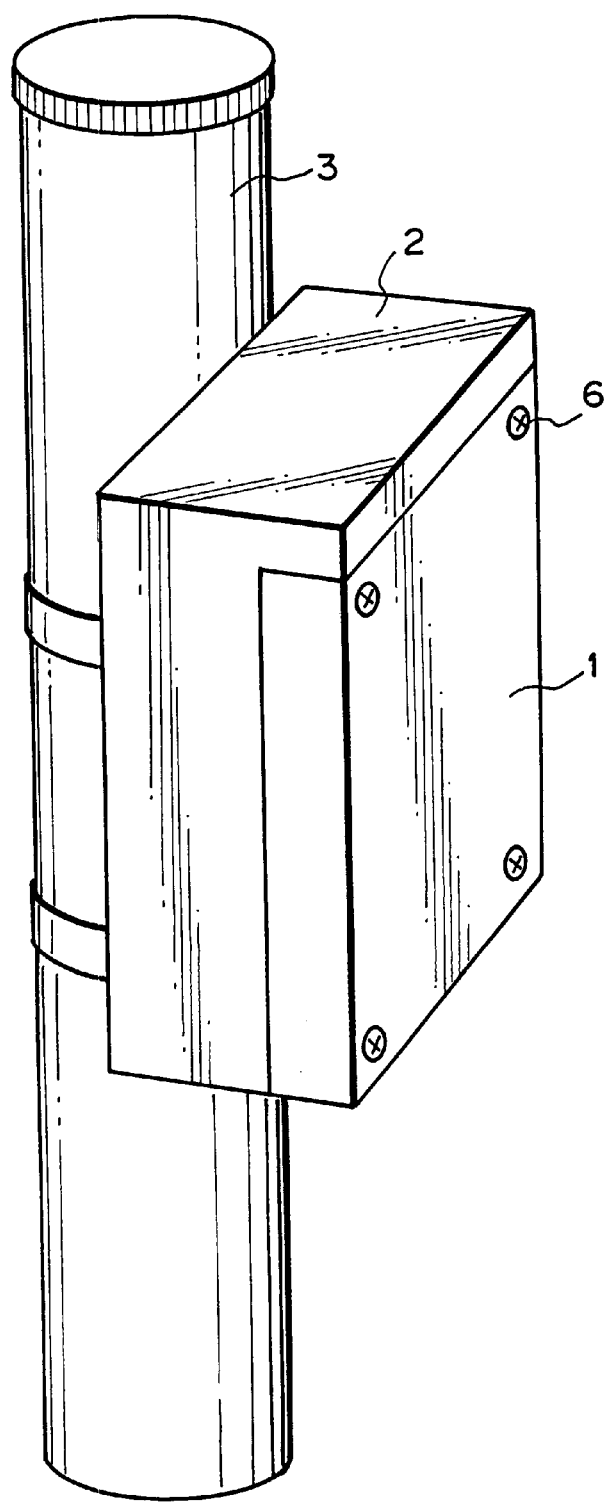
FIG. 5 is a perspective view showing the outlook of communication equipment according to another embodiment.

Next, the structure of another embodiment of the present invention will be described with reference to FIG. 5.

In the above embodiment, the fixing portion 2 is structured as an L-shaped pedestal. However, in this embodiment, the fixing portion 2 is designed in an inverted L-shape as shown in FIG. 5. Further, a hook(s) or the like is provided to the portion corresponding to a roof so as to easily suspend the main body portion 1 of the communication equipment, and the main body portion 1 is fixed to the fixing portion 2 by fixing screws 6. Therefore, the portion corresponding to the roof is designed in a drip-proof structure. The other structures and functions are the same as the above embodiment.

In order to perform the setup work of communication equipment, the weight of the communication equipment is preferably set so that a worker can carry out the communication equipment by himself/herself. According to the present invention, the fixing portion is first fixed to a pole and then the main body of the communication equipment is assembled. Therefore, the workability can be enhanced.

Further, when the main body of the communication equipment is subjected to maintenance, it is sufficient to exchange only the main body portion having a relatively higher failure risk, and it can be more easily detached from the pole. That is, by setting the weight of each of the fixing portion and the main body of the communication equipment to (for example) about 15 kg, a worker can easily perform the assembling or detaching work by himself/herself.

According to the present invention, the heat exchanger is mounted in the fixing portion, and the adjustment of the cooling capability can be performed in accordance with the setup environment.

What is claimed is:

1. A mount structure for communication equipment comprising a main body portion containing a communication circuit unit and a fixing portion containing a heat exchanger,
   wherein said main body portion is fixed on said fixing portion, and said main body portion and said fixing portion are designed to be separable from each other, and
   wherein said fixing portion has a substantially L-shape when viewed from the side of said fixing portion, and wherein said fixing portion serves as a stand on which said main body portion is supported.

2. The communication equipment mount structure as claimed in claim 1, wherein said stand has a projecting portion which can be fitted to a recess portion formed at the bottom portion of said main body portion.

3. The communication equipment mount structure as claimed in claim 1, wherein said main body portion is equipped with packing means for providing a waterproof fit to an engagement surface with said fixing portion.

4. A mount structure for communication equipment comprising a main body portion containing a communication circuit unit and a fixing portion containing a heat exchanger,
   wherein said main body portion is fixed on said fixing portion, and said main body portion and said fixing portion are designed to be separable from each other, and
   wherein said fixing portion takes in cold air from the outside by said heat exchanger installed therein, and blows the cold air to said main body portion to exchange the cold air with heat generated by said communication circuit unit, thereby cooling said main body portion.

5. The communication equipment mount structure as claimed in claim 1, wherein the heat exchange efficiency of said heat exchanger is selected in conformity with the calorific value of said main body portion and the surrounding environmental temperature condition of a setup place.

6. The communication equipment mount structure as claimed in claim 1, wherein said fixing portion has a substantially inverse-L shape when viewed from the side of said fixing portion, and wherein said fixing portion includes holding means on a top surface thereof for suspending said main body portion with respect to said fixing portion.

7. The communication equipment mount structure as claimed in claim 6, further comprising fixing means for fixedly attaching said main body portion to said fixing means.

* * * * *